United States Patent
Da Rocha Mordente

(10) Patent No.: US 9,175,634 B2
(45) Date of Patent: Nov. 3, 2015

(54) ENGINE COMPONENT

(75) Inventor: Paulo Jose Da Rocha Mordente, Viala Progresso (BR)

(73) Assignees: Mahle International GmbH (DE); Mahle Metal Leve S/A (BR)

(*) Notice: Subject to any disclaimer, the term of this patent is extended or adjusted under 35 U.S.C. 154(b) by 0 days.

(21) Appl. No.: 13/984,845

(22) PCT Filed: Feb. 9, 2012

(86) PCT No.: PCT/BR2012/000027
§ 371 (c)(1),
(2), (4) Date: Dec. 20, 2013

(87) PCT Pub. No.: WO2012/106791
PCT Pub. Date: Aug. 16, 2012

(65) Prior Publication Data
US 2014/0102399 A1 Apr. 17, 2014

(30) Foreign Application Priority Data
Feb. 10, 2011 (BR) ..................... 1100176

(51) Int. Cl.
*F02F 1/00* (2006.01)
*F02F 1/20* (2006.01)
(Continued)

(52) U.S. Cl.
CPC ............... *F02F 1/20* (2013.01); *C23C 16/029* (2013.01); *C23C 16/045* (2013.01); *C23C 16/26* (2013.01);
(Continued)

(58) Field of Classification Search
CPC C23C 16/045; C23C 16/0272; C23C 28/048; C23C 14/223; F01L 2101/00
USPC .......... 123/193.2, 193.4, 1 R, 668; 428/354, 428/446, 698; 427/237, 577, 450
See application file for complete search history.

(56) References Cited

U.S. PATENT DOCUMENTS 7,427,439 B2    9/2008  Saito et al.
2009/0011252 A1*  1/2009  Stein et al. .................... 428/446
(Continued)

FOREIGN PATENT DOCUMENTS

DE     102007047629 A1    10/2008
EP        1783349 A1     5/2007

OTHER PUBLICATIONS

English Translation of DE 10 2007 047629 A1, see "DE102007047629A1_MachineTranslation.pdf", dated on Oct. 16, 2008.*

*Primary Examiner* — Lindsay Low
*Assistant Examiner* — Long T Tran
(74) *Attorney, Agent, or Firm* — Fishman Stewart Yamaguchi PLLC

(57) ABSTRACT

The present invention has the objective of solving the problems encountered in coating engine components (engine blocks or sleeves, either fixed or movable) having at least one cylindrical cavity and composed mainly by iron or aluminum, providing them with a coating (3) that is subdivided into three different layers, which are deposited onto the metallic substrate (1), which are first sub-layer (21) comprising at least 80% silicon deposited onto the substrate (1) with the function of providing interface with good adhesion between the substrate (1) and the subsequent sub-layers, which contain hydrogenated amorphous carbon, second sub-layer (22) of transition comprising a percentage of silicon and of hydrogenated amorphous carbon (a-C:H:Si) and, finally, on the working surface, third sub-layer (23) having a pure composition of hydrogenated amorphous carbon (a-C:H), wherein such coating (3) is generated by the hollow cathode effect (HCE) by plasma-enhanced chemical vapor deposition (PECVD).

20 Claims, 1 Drawing Sheet

(51) Int. Cl.
*C23C 16/02* (2006.01)
*C23C 16/04* (2006.01)
*C23C 16/26* (2006.01)
*C23C 28/04* (2006.01)

(52) U.S. Cl.
CPC ............. *C23C 28/046* (2013.01); *C23C 28/048* (2013.01); *Y10T 428/24975* (2013.01); *Y10T 428/30* (2013.01)

(56) References Cited

U.S. PATENT DOCUMENTS

2009/0311443 A1\* 12/2009 Boardman et al. ............ 427/569
2010/0297440 A1\* 11/2010 Noll .............................. 428/354
2012/0318228 A1\* 12/2012 Aharonov ................. 123/193.2

\* cited by examiner

ENGINE COMPONENT

This application is a US national phase application of PCT/BR2012/000027, filed on Aug. 9, 2012, which claims priority to Brazilian patent application Pi1 100176-3, filed on Feb. 10, 2011, the contents of which are hereby incorporated by reference in their entirety.

The present invention relates to a cylinder of an engine block or of a removable sleeve of an internal combustion engine, having an amorphous carbon coating applied via chemical deposition in vapor phase, the coating comprising a transition layer containing silicon, the coating being carried out with the purpose of reducing the friction coefficient of the cylinder with its respective piston rings, improve wear resistance and prevent corrosion of the cylinder.

DESCRIPTION OF THE PRIOR ART

Cylinders of engine blocks or of removable sleeves of block of internal combustion engines are engine components that undergo high wear due to the type of work which they perform.

With the technological development of novel engines, their internal components have had greater stress, and to there have to be solutions capable of not only guaranteeing a better performance, but also of contributing to higher reliability of the engine.

On the basis of this principle a number of manufacturers have been trying to achieve various technical solutions, mainly for cylinders of engine block or removable sleeves of internal combustion engines.

One of the possible solutions that enable one to improve the performance of cylinders of engine blocks or of removable sleeves of internal combustion engines is to provide the internal surface of the cylinders with a coating.

Among the various possible coatings available today, the coating with amorphous carbon (a-C:H) exhibits a good potential as far as the reduction of the friction coefficient of the working surface is concerned, which enables one to reduce the wear of the contact surface and prevent corrosion of the protected surface. However, the coating with amorphous carbon, just as coatings in general, need good adhesion to the substrate onto which they are deposited.

In the case of amorphous carbon on the coating of a cylinder of engine blocks or removable sleeves of internal combustion engines, there are difficulties in both the method used to carry out the deposition of coating onto the substrate and the guarantee of a deposition with good adhesion.

On the other hand, the geometrical shape itself of the cylinder per se makes it difficult to deposit a coating onto its internal portion. For instance, the wording face of a piston ring is easily exposed, which enables one to apply a coating with an ease that is not allowed by a cylinder of engine block or of a removable sleeve. Additionally, supposing that one wants to coat the cylinders of an engine block, the deposition process becomes even more complex due to the size of an engine block and its respective maneuverability in comparison with simpler elements like rods, piston rings, etc.

The difficulties set forth with regard to efficiency in applying coatings onto the wording surface of cylinders are further aggravated by the fact that the amorphous carbon coatings exhibit some difficulties with regard to their adhesion to metallic substrates. A proof of this are the efforts of the art to the effect of solving such problems.

Among the various prior-art documents that suggest the use of amorphous carbon for coating cylinders, patent document EP 1783349 is the one that is most relevant to the present invention, since it discloses the use of an amorphous carbon coating with silicon (DLC-Si), suggesting also the application onto pistons, piston rings, cylinders and piston pins.

This document sets forth some of the advantages of DLC coatings, such as reducing the friction coefficient and, as a result, diminishing the wear of the parts, particularly when the parts are used under conditions where they come in contact with lubricating oils, so that they will not depend on adsorption or reactions to the additives present ion the lubricating fluids. This document further describes comparative tests with parts that receive three different types of coating: amorphous coating with silicon (DLC-Si), amorphous carbon (DLC) alone and chrome nitride (CrN). The tests disclose that the friction between two parts provided with an amorphous carbon coating with silicon (DLC-Si/DLC-Si) present at least 40% of reduction of the friction coefficient as compared with any other type of coating interface.

With a view to improve adhesion of the coating to the metallic substrate, the coating contains 1% to 20% of silicon in its composition. Particularly, with regard to cylinders, this document discloses that the coating can be applied to aluminum cylinders and cast iron, both to cylinders that are integral parts of the engine block or cylinder sleeves with only one amorphous carbon layer comprising silicon between 1% and 20%. On the other hand, the working portion of an amorphous carbon coating will contain a percentage of the silicon element (a-C:H:Si).

Even though this document does not disclose which maximum size the cylinder will have, it emphasizes that, for a ratio between the length and the diameter of the cylinder higher than 0.8, there are advantages when the film is formed by a plasma method by CVD (chemical vapor deposition) in direct current.

Additionally, this document indicates that, for working situations in which the sliding pressures are high, such as 100 MPa or higher, it is probable that the coating can detach from the inner surface of the cylinder. Even if the element silicon is used to aid in the adhesion of the coating, there will still be difficulty in adhesion.

Thus, it is clear that, although patent document EP1783349 presents the possibility of applying amorphous carbon coatings to cylinders and the advantages thereof, it also tries to solve a problem relating to the adhesion of the coating to the substrate using silicon for this function.

Anyway, the document itself presents limitations in the coating of cylinders with DLC. The difficulty that the lack of exposure of a cylinder represents in receiving the deposition of the coating as compared with the deposition technologies employed is an important hindrance to the success of the technology indicated in the document.

Thus, the difficulty presented by this document and by the prior-art technology is evident when it comes to depositing an amorphous carbon coating (a-C:H) to the inner walls of cylinders of engine blocks or of removable sleeves. Such difficulty is explained by the inevitable lack of exposure which the inner walls of the cylinders present. If we pay attention to the fact that the deposition methods employed until today, chemical vapor (CVD) or physical vapor deposition (PVD) bombard the inner walls of the cylinders from a position outside the cylinder, the problem of lack of exposure of a cylinder becomes clearer.

Such deposition difficulty will certainly have a great impact on the homogeneity of the coating deposited onto the substrate. As a result, it is known that a coating with a non-homogeneous deposition will not perform adequately the function of protecting the surface, and it is necessary to increase the thickness of the coating in order to guarantee total protection of the surface. This will lead to inner stress of the coating, which inevitably reduces the resistance to detachment.

Thus, however great the advances in chemical deposition of cylinder coatings with DLC, a technological advance is necessary in the sense that depositions of material with greater homogeneity should be promoted.

Prior-art document EP 1619265 presents a technology that, although applied in another field, has great relevance in the deposition of amorphous carbon coating inside geometries of tubular shape.

This document discloses a process and the system for coating with a DLC film inner surfaces of pre-manufactured tubes. The coating is carried out by causing the working piece to act as a cathode with connection to an anode at each entrance of the wording piece. A source of gas is introduced at one of the ends, and at the other end a vacuum pump is installed, so that this assembly is mounted to keep a condition that presents a hollow cathode effect (HCE).

The technology set forth by this document presents a process that is absolutely different from those used so far by the prior art. Naturally, the application thereof is intended for the coating of tubes. However, it opens the door for a new concept of DLC deposition inside tubular forms.

Moreover, even if the problems presented were solved in part, there are still some factors of productive order which have not yet been the object of deeper studies by the prior art. One of the most important refers to the homogeneity of the coating, to the velocity of the rates of deposition of the amorphous carbon onto the inner surface of the cylinders of internal combustion engines.

Thus, it should be noted that there is still no technological solution for the coating of components of en engine provided with at least one cylinder, inside which the piston moves, with amorphous carbon that achieves good adhesion of the coating, coupled to a process that is economically feasible and highly productive, thus resulting in a cylinder provided with higher technical characteristics that enable the development of the engine industry.

OBJECTIVES OF THE INVENTION

Therefore, it is an objective of the present invention to provide a carbon-type coating on the working surface of a cylinder of an internal combustion engine, capable of achieving high adhesion by virtue of the presence of an intermediate layer containing silicon.

It is also an objective of the present invention to guarantee a coating having a low friction coefficient, high mechanical hardness, low wear and low corrosion.

BRIEF DESCRIPTION OF THE INVENTION

The objectives of the present invention are achieved by providing an engine component having at least one cylindrical cavity, inside which a piston moves, the cylindrical cavity comprising an inner surface having a substrate of metallic base, to which one applies at least one coating comprising first sub-layer adjacent the substrate, the first sub-layer comprising at least 80% of silicon with diffusion to the substrate, second sub-layer of transition arranged between the first sub-layer and the third sub-layer, the second sub-layer being composed of hydrogenated amorphous carbon and silicon, and third sub-layer overlapping the second sub-layer, comprising substantially 100% of hydrogenated amorphous carbon.

BRIEF DESCRIPTION OF THE DRAWINGS

The present invention will now be described in greater detail with reference to examples of embodiments represented in the drawings. The Figures show.

DETAILED DESCRIPTION OF THE FIGURES

The present invention proposes a diamond-like carbon coating 3, applied to engine components (engine blocks having at least one cylinder or engine sleeves, either fixed or movable), defining at least one cylindrical cavity, inside which a cylinder piston moves.

The present invention seeks to achieve a coating 3 which will exhibit low friction coefficient, capable of guaranteeing less wear on the contact/working surface, guaranteeing good adhesion of the coating 3 to the substrate 1.

With a view to overcome problems of the prior art, the present invention proposes a technological solution that provides a coating 3 of hydrogenated amorphous carbon (a-C:H), provided with an innovatory chemical composition, a method for depositing the coating 3, which enables one to achieve extremely advantageous characteristics for both the product and the production.

Figure 1:
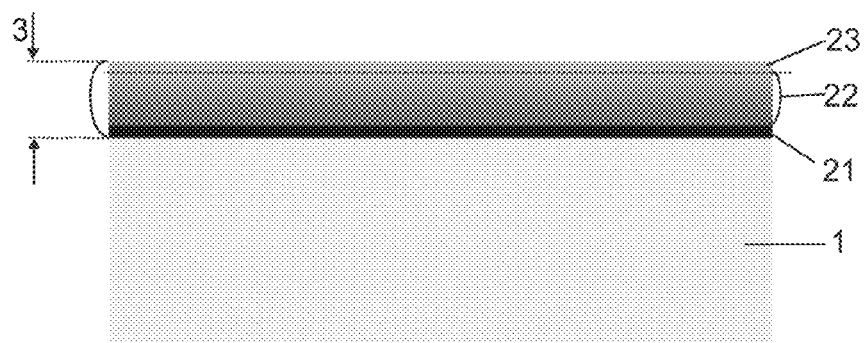
FIG. 1 is a scheme of the coating of the present invention.

FIG. 1 represents a portion of a cylindrical cavity after having received the coating 3 of the present invention (either from an engine block or from a fixed or movable sleeve). For a better understanding, the cylindrical cavity that will be subjected to the coating 3 of the present invention has, on its inner surface, a portion that will receive the coating 3, which will be called substrate 1 from now on. The substrate 1 of the cylindrical cavities of the present invention are preferably of metallic base, composed mainly by cast iron, steel or aluminum. Preferably, but not compulsorily the substrate 1 may be made of perlitic nodular cast iron.

The coating 3 is subdivided into three different sub-layers, which are deposited onto the substrate 1. First sub-layer 21 comprising at least 80% of silicon is deposited onto the substrate 1 with the function of providing an interface of good adhesion between the metallic substrate and the subsequent sub-layers, which contain hydrogenated amorphous carbon.

After the first sub-layer 21 of silicon, second transition sub-layer 22 is deposited, which contains a percentage of silicon and of hydrogenated amorphous carbon (a-C:H). Finally, on the outer surface or working surface the coating 3 has third sub-layer 23 having a pure composition of hydrogenated amorphous carbon (a-C:H), with substantially 100% of a-C:H, this third sub-layer 23 preferably extending up to 1 micrometer depth.

Therefore the coating 3 is composed of three different sub-layers, namely: first sub-layer 21, which comprises at least 80% silicon, followed by second transition sub-layer 22, which comprises silicon and hydrogenated amorphous carbon and, finally, third sub-layer 23 containing 100% hydrogenated amorphous carbon.

Figure 2:
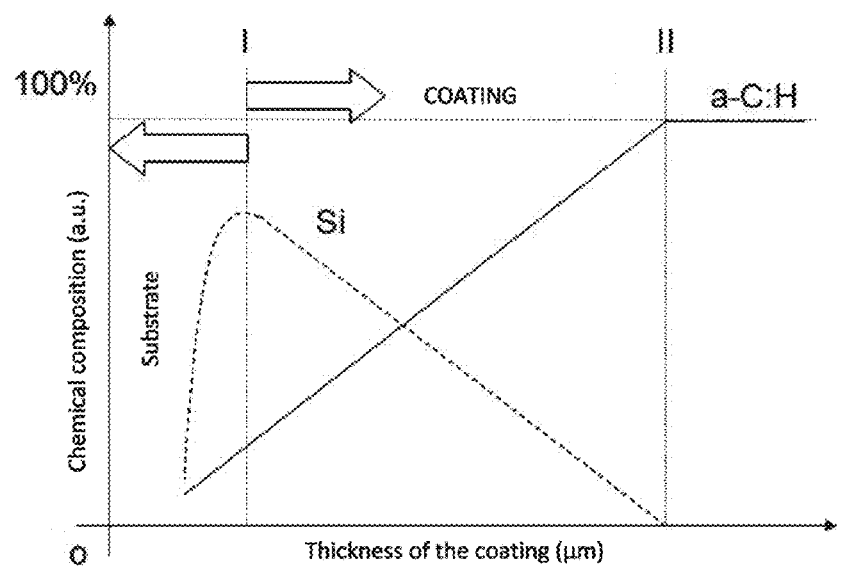
FIG. 2 is a distribution of the chemical elements present in the coating of the present invention.

One should still note that the second transition sub-layer 22 has an amount of silicon that decreases as the coating 3 approaches the third sub-layer 23, Similarly, the second transition sub-layer 22 has an increase in hydrogenated amorphous carbon as the coating approaches the third sub-layer 23, ending with an amount of 100% of hydrogenated amorphous carbon in the third sub-layer 23. Due to the composition of the coating 3 of the present invention, one can say that the second sub-layer 22 is arranged between the first sub-layer 21 and the third sub-layer 23 comprises amounts of hydrogenated amorphous carbon and silicon that vary inversely with each other from the first sub-layer 21 and third sub-layer 23, and that such variation takes place gradually. In other words, as the first sub-layer 21 moves away, the amount of silicon in the coating 3 will always decrease and the amount of hydrogenated amorphous carbon will always increase until it reaches 10% in the third sub-layer 23 (see FIG. 2).

The presence of the element silicon in such a gradual manner has the objective of promoting better adhesion between the metallic substrate 1 and the third sub-layer 23 of hydrogenated amorphous carbon. Due to the deposition conditions, the first sub-layer 21, adjacent the substrate 1, may be mistaken for the latter, so that the elements that compose the first sub-layer 21 exhibits diffusion into the material that composes the substrate 1. This detail can be observed ion FIG. 2, being represented by the region on the left of line I, which represents the transition between the first sub-layer 21 and the substrate 1. This diffusion will also take place for the second sub-layer 22, composed of hydrogenated amorphous carbon.

One should note that the chemical composition of the coating 3 of the present invention and its notable advantages could only be achieved by virtue of the deposition technology employed.

Thus, the diamond-like carbon coating 3 make use of a technological principle that is similar to that presented in document Patent EP1783349. Alternatively, the coating 3 may be deposited by any other technological principle, as long as the properties of the presented coating 3 will be guaranteed, that is, a coating 3 comprising three sub-layers 21, 22, 23, namely: first sub-layer 21 adjacent the metallic substrate 1 for nucleation/adherence with silicon, second transition sub-layer 22 having silicon and hydrogenated amorphous carbon, overlapping the first sub-layer 21 and, finally, third sub-layer 23 of 100% hydrogenated amorphous carbon, overlapping the second sub-layer 22.

Preferably, but not compulsorily the coating 3 described is achieved by means of a new technique for coating conductive inner surfaces, which enables deposition generated by the hollow cathode effect (HCE) by Plasma-enhanced chemical vapor deposition (PECVD).

The coating 3 of the inner surface of the cylindrical cavity is carried out by connection to a source of voltage, so that the working piece will function as a cathode and by connection of an anode to each of the two inlets of the piece. Subsequently, one introduces a source of gas into an entry opening, a vacuum pump being connected to an opposite outlet. The coating 3 is carried out while monitoring the pressure inside the cylinder and the information of the resulting pressure is used to keep a condition that will exhibit the hollow cathode effect. One can further carry out a previous cleaning with hydrocarbons, as well as by applying a negative source to the cylinder so as to pulverize the contaminants of the working piece using gas, for instance, argon. in this case, one may use, as precursors, hydrocarbons (C2H2) to deposit the DLC coatings 3, since they are inert and have high resistance to corrosion.

Even though this principle can be applied to any coating on metal, ceramics or DLC that has the desired properties, the coating 3 of the present invention makes use of DLC with sp3 (diamond-like) bindings, resulting in a hard coating 3 on the working surface, having low friction, with excellent adhesion and resistance to corrosion.

Thus, one used amorphous carbon with silicon, the element silicon being used successfully as a doping agent employed in addition to the DLC matrix, improving the thermal stability of the coating 3 and contributing to reducing the compression rate.

Naturally the present invention enables numberless variables, and its excellent results are achieved by keeping the high plasma densities through asymmetric bipolar direct current (DC), enabling one to achieve deposition rates on the order of at least 1 micrometer per minute. One should note that the traditional processes disclosed in the prior art are capable of achieving deposition rates on the order of 1 micrometer per hour. Thus, the present invention provides a markedly higher productive capacity, enabling deposition rates about sixty times as high the prior art.

As advantages, the coating 3 of the present invention does not modify the original topography of the cylindrical cavity, guarantees the achievement of reduction to wear of at least 50% as compared with a regular structure of cast iron, prevents undesired deposition of coal residues from incomplete combustion in the engine inside the cylinder, and greatly reduces the friction coefficient by virtue of a ring without the coating 3.

Additionally, the coating 3 in question imparts to the cylindrical cavity properties of the diamond itself, such as, for example, high mechanical hardness and chemical and electromechanical inertia. Tribologically, it is extremely attractive due to its low friction and low wear, which are points of great importance in the various mechanical applications, especially in those that have relative motion sliding.

Naturally such characteristics may vary greatly, depending on the conditions and method of deposition. So, the coating 3 of the present invention may have a thickness ranging from 1 to 25 micrometers, the amount of hydrogen may range from 3 to 40 by atomic percentage, its hardness may range from 7 to 40 gigapascal (GPa), its adhesion measured by scratch test is of at least 30 N and may reach 150N, according to rule ISO 14577, the internal stress is preferably lower than 1.5 (GPa). As far as roughness is concerned, even though it can exhibit any value, it will be preferably lower than 0.3 micron Rpk, 1 micron Rk and 3 micron Rvk.

Thus, the present invention achieves a product having various advantages at the level of its mechanical, chemical, tribological properties, etc, further bringing about great ease in producing such coatings 3, by virtue of the fact that it presents a deposition method with high productive capacity and low rejection.

Preferred examples of embodiments having been described, one should understand that the scope of the present invention embraces other possible variations, being limited only by the contents of the accompanying claims, which include the possible equivalents.

The invention claimed is:

1. An engine component comprising: at least one cylindrical cavity including an internal surface having a substrate of a metallic base to which at least one coating is applied, the coating including:
   a first sub-layer adjacent to the substrate and including a composition of at least 80% of silicon, wherein the composition of at least 80% of silicon of the first sub-layer is at least partially diffused into the substrate;
   a second transitional sub-layer arranged between the first sub-layer and a third sub-layer, the second sub-layer including a composition of hydrogenated amorphous carbon and silicon;
   wherein the third sub-layer overlaps the second sub-layer, the third sub-layer including a composition having at least 100% hydrogenated amorphous carbon; and wherein the coating includes an adhesion measured by scratch test of approximately 30N to 150N, the coating being deposited onto the metallic substrate, the deposition of the coating being generated by plasma-enhanced chemical vapor deposition applied by a hollow cathode effect created inside the at least one cylindrical cavity.

2. The engine component of claim 1, wherein the composition of the second sub-layer includes an amount of hydrogenated amorphous carbon and silicon varying inversely from each other from the first sub-layer to the third sub-layer, wherein the amount of silicon decreases as the second sub-layer approaches the third sub-layer.

3. The engine component of claim 1, wherein the coating includes a thickness of approximately 1 μm to 25 μm.

4. The engine component of claim 1, wherein the coating includes a hardness of 7 GPa to 40 GPa.

5. The engine component of claim 1, wherein the coating includes an internal stress of not more than 2.5 GPa.

6. The engine component of claim 1, wherein the substrate is composed of at least one of iron and steel.

7. The engine component of claim 1, wherein the substrate is composed of aluminum.

8. The engine component of claim 1, wherein the hollow cathode effect provides the coating by plasma-enhanced chemical vapor deposition.

9. The engine component of claim 8, wherein the rate of deposition of the coating is at least one micrometer per minute.

10. The engine component of claim 1, wherein the third sub-layer includes a thickness of 1 μm or less.

11. An engine component, comprising:
at least one cylindrical cavity including an internal surface having a substrate of a metallic base to which at least one coating is disposed, the coating including:
a first sub-layer disposed on the substrate and including a composition of at least 80% of silicon, wherein the composition of at least 80% of silicon of the first sub-layer is at least partially diffused into the substrate; and
a second transitional sub-layer arranged between the first sub-layer and a third sub-layer, the second sub-layer including a composition of hydrogenated amorphous carbon and silicon;
the third sub-layer overlaying the second sub-layer, the third sub-layer including a composition having at least 100% hydrogenated amorphous carbon;
wherein the coating includes an internal stress of 2.5 GPa or less, the coating being deposited onto the metallic substrate, the deposition of the coating being generated by plasma-enhanced chemical vapor deposition via a hollow cathode effect created inside the at least one cylindrical cavity.

12. The engine component of claim 11, wherein the composition of the second sub-layer includes an amount of hydrogenated amorphous carbon and silicon varying inversely from each other from the first sub-layer to the third sub-layer, wherein the amount of silicon decreases as the second sub-layer approaches the third sub-layer.

13. The engine component of claim 11, wherein the coating includes a thickness of approximately 1 μm to 25 μm.

14. The engine component of claim 11, wherein the coating includes a hardness of 7 GPa to 40 GPa.

15. The engine component of claim 11, wherein the coating includes an adhesion measured by scratch test of approximately 30N to 150N.

16. The engine component of claim 11, wherein the substrate is composed of at least one of iron and steel.

17. The engine component of claim 11, wherein the substrate is composed of aluminum.

18. The engine component of claim 11, wherein the hollow cathode effect deposits the coating by plasma-enhanced chemical vapor deposition.

19. The engine component of claim 18, wherein the rate of deposition of the coating is at least one micrometer per minute.

20. The engine component of claim 11, wherein the third sub-layer includes a thickness of 1 μm or less.

* * * * *